(12) United States Patent
Nagai et al.

(10) Patent No.: US 6,275,515 B1
(45) Date of Patent: Aug. 14, 2001

(54) SEMICONDUCTOR LASER DEVICE AND METHOD OF PRODUCING THE SAME

(75) Inventors: Yutaka Nagai; Yutaka Mihashi; Motoharu Miyashita, all of Tokyo; Yasutomo Kajikawa, Shimane, all of (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/238,170

(22) Filed: Jan. 28, 1999

(30) Foreign Application Priority Data

Aug. 4, 1998 (JP) .................................................. 10-220456

(51) Int. Cl.$^7$ .............................. H01S 5/00; H01L 21/20; H01L 21/36
(52) U.S. Cl. .............................. 372/45; 372/43; 438/478
(58) Field of Search .................................. 372/43–45, 96; 438/478

(56) References Cited

U.S. PATENT DOCUMENTS

| | | | |
|---|---|---|---|
| 5,079,184 | * 1/1992 | Hatano et al. | 437/107 |
| 5,462,008 | * 10/1995 | Razeghi | 117/2 |
| 5,675,605 | * 10/1997 | Fujii | 372/96 |
| 5,841,156 | 11/1998 | Kajikawa et al. | 257/183 |
| 6,072,817 | * 6/2000 | Adachi et al. | 372/45 |
| 6,121,051 | * 9/2000 | Bertness | 436/164 |

FOREIGN PATENT DOCUMENTS 3152983    6/1991   (JP) .

OTHER PUBLICATIONS

Asahi et al., "New III–V Compound Semiconductors T1 InGaP For 0.9 $\mu$m To Over 10$\mu$m Wavelength Range Laser Diodes And Their First Successful Growth", Japanese Journal of Applied Physics, vol. 35, Jul. 1996, pp. L876–L879.
Kondow et al., "GaInNAs: A Novel Material For Long–Wavelength–Range Laser Diodes With Excellent High–Temperature Performance", Japanese Journal of Applied Physics, vol. 35, Feb. 1996, pp. 1273–1275.

* cited by examiner

*Primary Examiner*—Teresa M. Arroyo
*Assistant Examiner*—James Menefee
(74) *Attorney, Agent, or Firm*—Leydig, Voit & Mayer, Ltd.

(57) ABSTRACT

A semiconductor laser device on a GaAs substrate and having an oscillation wavelength of 1.3 $\mu$m or 1.55 $\mu$m and a method of producing the laser device. The laser device has a BTlGaAs active layer that lattice matches with the GaAs substrate. To grow the BTlGaAs active layer, organometallic vapor phase deposition is employed with cyclopentadienyl thallium as the source of Tl.

16 Claims, 4 Drawing Sheets

SEMICONDUCTOR LASER DEVICE AND METHOD OF PRODUCING THE SAME

BACKGROUND OF THE INVENTION

1. Field of the Invention

The present invention relates to a semiconductor laser device having a BTlGaAs active layer on a GaAs substrate and operating in a long wavelength region for communication purposes.

2. Description of the Related Art

Optical communication generally employs signal light having wavelengths of 1.3 μm and 1.55 μm, and an InGaAsP/InP semiconductor laser device on an InP substrate is used as the light source.

However, the InGaAsP/InP semiconductor laser has a problem that the discontinuity in the conduction band between the InGaAsP active layer and InP clad layers which sandwich the active layer is as small as about 100 meV and, as a consequence, overflow of electrons from the active layer into the clad layer becomes conspicuous as the temperature rises, resulting in rapidly increasing current.

A GaAs/AlGaAs laser and a strained quantum well laser based on InGaAs/AlGaAs on a GaAs substrates, on the other hand, can provide better temperature characteristics because AlGaAs having a larger band gap energy can be used as the clad layer which produces a discontinuity in the conduction band as large as 300 meV or greater.

When producing a surface emitting laser with a perpendicular resonance, a GaAs/AlAs semiconductor multi-layer film can be used as a reflector layer, and therefore high reflectivity can be obtained.

It is difficult to make practical use of an active layer material which can be grown on a GaAs substrate while achieving lattice matching with the GaAs substrate and is capable of oscillating with a wavelength of 1.3 μm or 1.55 μm.

Researches on growing a semiconductor layer made of a GaInNAs material on a GaAs substrate have been done (for example, Kondo & Uomi; Applied Physics vol.65 (1996), p148), but commercial applications have not been achieved due to a problem in crystalline characteristics and other reasons.

SUMMARY OF THE INVENTION

That is, an object of the present invention is to provide a semiconductor laser device on a GaAs substrate and oscillating with a wavelength of 1.3 μm or 1.55 μm, and a method of producing the same.

The present inventors have studied intensively. Found that a semiconductor laser device having a BTlGaAs layer used an active layer is capable of lattice matching with a GaAs substrate and oscillating with a wavelength of 1.3 μm or 1.55 μm, and particularly that a BTlGaAs layer of better crystalline characteristics can be obtained by employing an organometallic vapor phase deposition process wherein cyclopentadienyl thallium is used as a source for supplying Tl when growing the BTlGaAs layer. Thus, the present invention has been completed.

That is, the present invention provides a semiconductor laser device comprising at least a first clad layer of a first conductivity type, an active layer, a second clad layer of a second conductivity type and a contact layer of the second conductivity type formed successively on a GaAs substrate of the first conductivity type, with current flowing across the GaAs substrate and the contact layer thereby to carry out laser oscillation in the active layer, wherein the active layer is made of a GaAs based mixed crystal semiconductor of III and V groups of zincblende structure with part of the Ga atoms being substituted with at least B and Tl.

As the active layer is made of the GaAs based mixed crystal semiconductor of III and V groups of zincblende structure with the group III elements consisting of at least Ga, and B and Tl substituting Ga, and with the group V element consisting of As, thereby to optimize the composition of the active layer, then it is made possible to produce a semiconductor laser device which has a BTlGaAs layer used an active layer and is capable of lattice matching with a GaAs substrate and oscillating with a wavelength of 1.3 μm or 1.55 μm.

The active layer made of GaAs based mixed crystal semiconductor preferably has the following composition.

$(B_{1-x}Tl_x)_{1-y}Ga_yAs (0<x<1, 0<y<1)$

The active layer may also have quantum well structure of BTlGaAs/BTlAlGaAs.

It is because threshold value of the semiconductor laser device can be decreased by employing the structure described above.

The BTlGaAs preferably has a band gap which corresponds to a wavelength of 1.3 μm or 1.55 μm.

The BTlGaAs preferably has a composition of $(B_{0.38}Tl_{0.62})_{0.27}Ga_{0.73}As$ or $(B_{0.3}Tl_{0.7})_{0.36}Ga_{0.64}As$.

It is because these compositions enable the semiconductor laser device to oscillate at a wavelength of 1.3 μm or 1.55 μm, respectively.

Peak wavelength of the laser output light is preferably 1.3 μm or 1.55 μm, to meet the wavelength requirement in the optical communications.

The active layer is preferably made of a GaAs based mixed crystal semiconductor of III and V groups of zincblende structure with a part of the Ga atoms being substituted with at least B and Tl, in order to achieve matching or quasi-matching with the lattice constant of the GaAs substrate.

Lattice matching between the GaAs substrate and the active layer makes it possible to improve the performance characteristics of the semiconductor laser device, particularly to decrease the threshold current by employing the quasi-matched strained quantum well structure.

The present invention also provides a semiconductor laser device which has a reflecting layer in each of the lower portion of the first clad layer and the upper portion of the second clad layer, and causes laser oscillates to occur between the reflecting layers as a surface emitting laser of perpendicular resonance type.

The reflecting layers are preferably AlAs/GaAs reflecting layers.

The semiconductor laser device of the present invention is formed on the GaAs substrate, and therefore the AlAs/GaAs reflecting layers of high reflectivity can be formed while maintaining lattice matching. The reflecting layers may also be made in multi-layer structure.

The first clad layer and the second clad layer are preferably made of AlGaAs layers.

By using the AlGaAs layer for the clad layers, it is made possible to make the discontinuity in the conduction band between the active layer and the clad layers as large as 300 meV or higher. As a result, overflow of electrons from the active layer into the clad layer does not occur even at high temperatures and good temperature characteristics can be obtained.

The present invention also provides a method of producing a semiconductor laser device, which comprises forming at least a first clad layer, an active layer made of BTlGaAs, a second clad layer and a contact layer, successively, on a GaAs substrate by a crystal growing process, wherein said crystal growing process is an organometallic vapor phase deposition process.

The active layer made of BTlGaAs can be formed with good crystalline characteristics by employing the organometallic vapor phase deposition process.

It is preferable that cyclopentadienyl thallium be used for the source of supplying Tl to the active layer.

It is preferable that triethylboron be used for the source of supplying Tl to the active layer.

As will be clear from the above description, in the semiconductor laser device of the present invention, long-wavelength laser having oscillation wavelength of 1.3 μm or 1.55 μm can be formed on the GaAs substrate by forming the active layer made of BAlGaAs on the GaAs substrate.

As a result, it is made possible to use the AlGaAs layer as the clad layer, and the discontinuity in the conduction band between the active layer and the clad layers can be made as large as 300 meV or higher, thereby achieving good temperature characteristics, In case the semiconductor laser device is made as a surface emitting laser, the AlAs/GaAs layer having high reflectivity can be used as the reflector film.

Since the GaAs substrate which has greater size than the InP substrate and is hard to crack is used, it is made possible to improve the yield of production and reduce the production cost.

Also according to the method of producing the semiconductor laser device of the present invention, by employing the organometallic vapor phase deposition process where triethylboron is used for the source of supplying B and cyclopentadienyl thallium is used for the source of supplying Tl when growing the BTlGaAs active layer, it is made possible to form the active layer of good crystalline characteristics.

DESCRIPTION OF THE PREFERRED EMBODIMENTS

Embodiment 1

Now the first embodiment of the present invention will be described below with reference to FIGS. 1 to 3.

Figure 1:
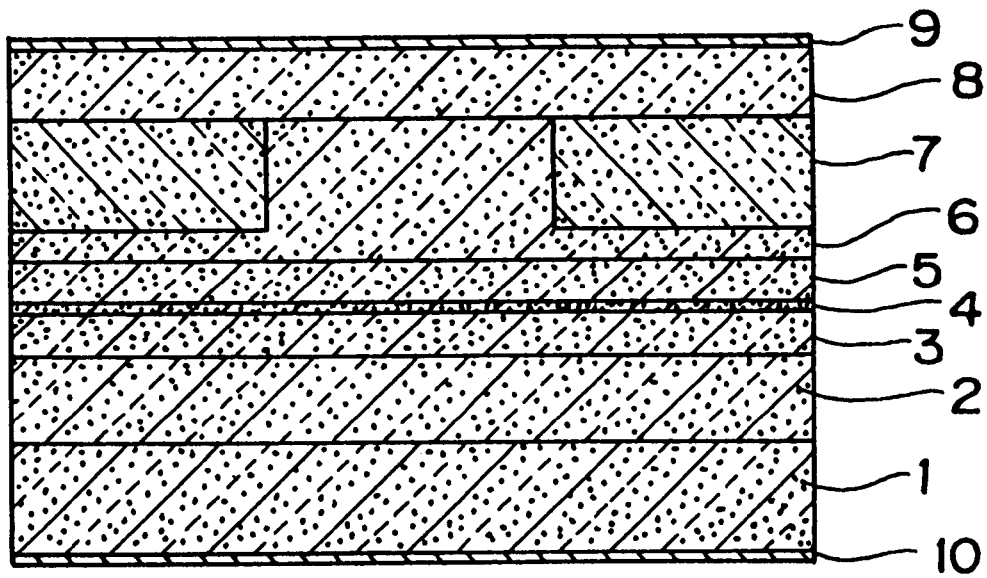
FIG. 1 is a cross sectional view of the stripe type quantum well laser according to the first embodiment of the present invention.

FIG. 1 is a cross sectional view of a stripe type quantum well semiconductor laser where a $(B_{0.38}Tl_{0.62})_{0.27}Ga_{0.73}As$ quantum well layer is used as an active layer, showing a cross section perpendicular to the direction of a resonator. In the drawing, numeral 1 denotes an n-type GaAs substrate, 2 denotes a lower clad layer of n-type $Al_{0.3}Ga_{0.7}As$ with a thickness of 2 μm (concentration of n-type impurity $4\times10^{17}$ cm$^{-3}$), 3 denotes a lower guide/barrier layer of undoped GaAs with a thickness of 24 nm, 4 denotes a quantum well active layer of undoped $(B_{0.38}Tl_{0.62})_{0.27}Ga_{0.73}As$ with a thickness of 10 nm, 5 denotes an upper guide/barrier layer of undoped GaAs with a thickness of 24 nm, 6 denotes an upper clad layer of p-type $Al_{0.3}Ga_{0.7}As$ with a thickness of 2 μm (concentration of p-type impurity $2\times10^{18}$ cm$^{-3}$), 7 denotes a current blocking layer of n-type $Al_{0.7}Ga_{0.3}As$, 8 denotes a contact layer of p-type GaAs, 9 denotes a front side ohmic electrode and 10 denotes a back side ohmic electrode.

In the quantum well semiconductor laser of this configuration, a reverse bias is applied across the pn junction in a portion covered by the n-type $Al_{0.7}Ga_{0.3}As$ blocking layer 7 (junction between the blocking layer 7 and the upper clad layer 6 made of p-type $Al_{0.3}Ga_{0.7}As$), thereby blocking current flow. Consequently, current supplied through the front side ohmic electrode 9 is concentrated and flow only in the upper clad layer 6 of $Al_{0.3}Ga_{0.7}As$ in a stripe configuration surrounded by the block layer 7, so that the current is injected efficiently into the active layer 4 and laser oscillation is effected.

While $(B_{0.3}Tl_{0.62})_{0.27}Ga_{0.73}As$ is used for the quantum well active layer 4 in the stripe type quantum well semiconductor laser of FIG. 1, in order to grow a crystal of satisfactory quality to make the active layer of the semiconductor laser device on the GaAs substrate, the lattice constant of the crystal must be the same as that of GaAs or, when not the same, the difference must be sufficiently small.

A significant difference in the lattice constant causes lattice defects and dislocations to be introduced into the growing crystal layer thus significantly deteriorating the crystal quality.

Figure 3:
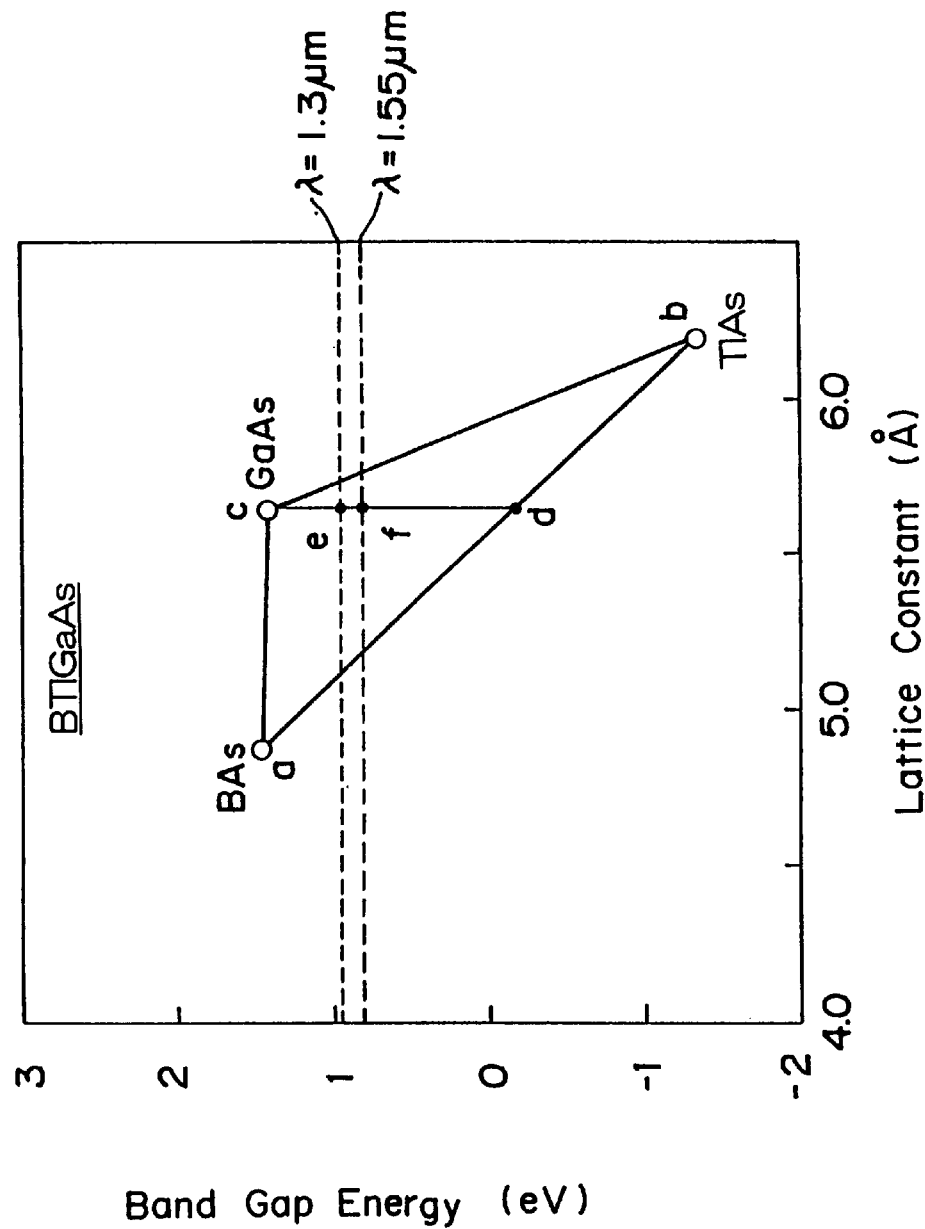
FIG. 3 shows the relation between the lattice constant and the band gap energy of BTlGaAs.

FIG. 3 shows the relation between the lattice constant and band gap energy when the proportions of elements in the composition of BTlGaAs are changed, with the lattice constant (Å) of the BTlGaAs layer plotted along the horizontal axis and the band gap energy (eV) of the BTlGaAs layer plotted along the vertical axis. According to the computation by van Schilfgaarde et al. (van Schilfgaarde et al., Applied Physics Letters, vol. 65, p.2714 (1994)), TlAs (point b in FIG. 3) is a semi-metal having a lattice constant of 6.18 Å and a band gap energy of −1.34 eV. According to the computation by O. Madelung Ed., "Semiconductors: Basic Data", Springer (1996), BAs (point a in the drawing) has a lattice constant of 4.78 Å and a band gap energy of 1.46 eV. When a linear Vegard's law is assumed, $B_{0.38}Tl_{0.62}As$ (point d on line segment ab) is a semi-metal having a band gap energy of −0.28 eV and a lattice constant of 5.65 Å which is the same as that of GaAs.

Also $(B_{0.38}Tl_{0.62})_xGa_{1-x}As$ (point on line segment cd) has a lattice constant of 5.65 Å which is the same as that of GaAs, with the band gap energy changing from −1.42 eV to −0.28 eV as the value of X changes from 0 to 1. Thus when x=0.27 (point e in the drawing) in $(B_{0.38}Tl_{0.62})_xGa_{1-x}As$, a band gap energy corresponding to an oscillation wavelength of λ=1.3 μm is obtained and, when x=0.36 (point f in the drawing), a band gap energy corresponding to an oscillation wavelength of λ=1.55 μm is obtained.

Thus by using the BTlGaAs layer for the active layer, it is possible to obtain the active layer 4 which lattice matches with the GaAs substrate 1 and has a wavelength of semiconductor laser oscillation of 1.3 μm or 1.55 μm.

Particularly in a semiconductor laser employing the BTlGaAs layer on the GaAs substrate as the active layer 4 as described above, the clad layer can be AlGaAs which offers a relatively high band gap energy and, with arbitrarily set proportions, lattice matches with GaAs.

As a result, discontinuity in the conduction band between the active layer 4 and the clad layers 2 and 5 can be as large as 300 meV or higher, thus making it possible to produce a semiconductor laser having a good temperature characteristic, so that overflow of electrons from the active layer into the clad layer does not occur, even at high temperatures.

While a single layer of BTlGaAs is used for the active layer 4 in this embodiment, a quantum well structure may also be employed by using $(B_{0.38}Tl_{0.62})_xGa_{1-x}As$ as the well layer. In this case, a GaAs layer or an AlGaAs layer may be used for the barrier layer of the quantum well structure.

Now a method of producing the semiconductor laser device according to this embodiment will be described below with reference to FIGS. 2A–2D.

Figure 2A:
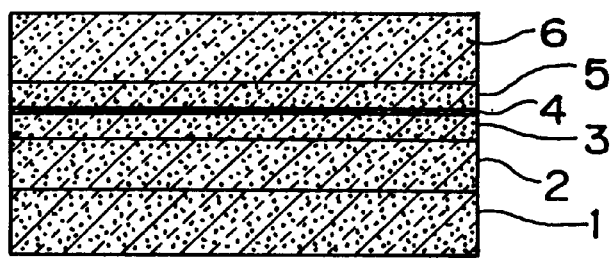
FIGS. 2A–2D are cross sectional views of the production process of the stripe type quantum well laser according to the first embodiment of the present invention.

First, as shown in FIG. 2A, the lower clad layer 2 of n-type $Al_{0.3}Ga_{0.7}As$ with a thickness of 2 $\mu$m, the lower guide/barrier layer 3 of undoped GaAs with a thickness of 24 nm, the quantum well active layer 4 of $(B_{0.38}Tl_{0.62})_{0.27}Ga_{0.73}As$ with a thickness of 10 nm, the upper guide/barrier layer 5 of undoped GaAs with a thickness of 24 nm, and the upper clad layer 6 of p-type $Al_{0.3}Ga_{0.7}As$ with a thickness of 2 $\mu$m are formed successively on the n-type GaAs substrate 1 by MOCVD (organometallic vapor phase deposition).

In the MOCVD growth process, trimethyl gallium (TMG) is used as a Ga source, trimethyl aluminum (TMA) is used as an Al source and arsine ($AsH_3$) is used as an As source, when growing the GaAs layer and the AlGaAs layer, similar to the prior art.

When growing the $(B_{0.38}Tl_{0.62})_{0.27}Ga_{0.73}As$ layer, while materials similar to those used in the prior art are used for the sources of Ga and As, triethylboron $((C_2H_5)_3B)$ is additionally used as the source of B and cyclopentadienyl thallium $((C_5H_5)Tl)$ is used as a source of Tl.

As a reactor furnace for crystal growth in the MOCVD process, a conventional horizontal furnace or vertical furnace is used where the layers are grown at temperatures from 600° C. to 750° C. under a lowered pressure of 50 to 200 hPa. With this process, the abruptness between the grown layers at the interface can be increased and a better quantum well active layer 4 of $(B_{0.38}Tl_{0.62})_{0.27}Ga_{0.73}As$ can be made.

By using triethylboron $((C_2H_5)_3B)$ as the B source and cyclopentadienyl thallium $((C_5H_5)Tl)$ as the Tl source, it is possible to grow a BAlGaAs layer having good crystalline characteristics, which has been difficult to obtain with the prior art.

The novel process succeeds because triethylboron and cyclopentadienyl thallium have vapor pressures suitable for growing the crystal by MOCVD and are therefore good materials the crystal.

Figure 2B:
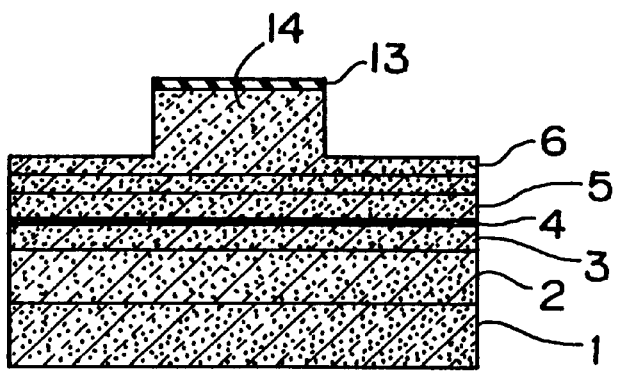

Then, as shown in FIG. 2B, an $SiO_2$ film is formed by sputtering on the upper clad layer 6 of $Al_{0.3}Ga_{0.7}As$, which is the top layer of the epitaxial layers of double heterostructure formed in the process described above, and an etching mask 13 of $SiO_2$ is formed using conventional photolithography technology.

The $SiO_2$ mask 13 is used to form a ridge 14 having a stripe configuration by wet etching or dry etching of the clad layer 6 of p-type $Al_{0.3}Ga_{0.7}As$.

Figure 2C:
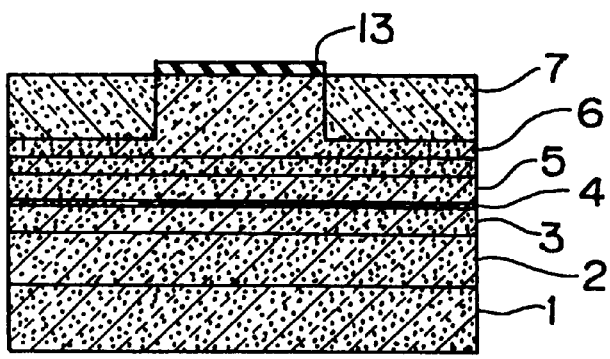

The etching mask 13 of $SiO_2$ formed in the process shown in FIG. 2B is used without modification as a selective growth mask to selectively grow the current blocking layer 7 of n-type $Al_{0.7}Ga_{0.3}As$ by MOCVD, as shown in FIG. 2C.

Then, after removing the $SiO_2$ mask 13, a p-type GaAs contact layer 8 is formed by crystal growth.

Figure 2D:
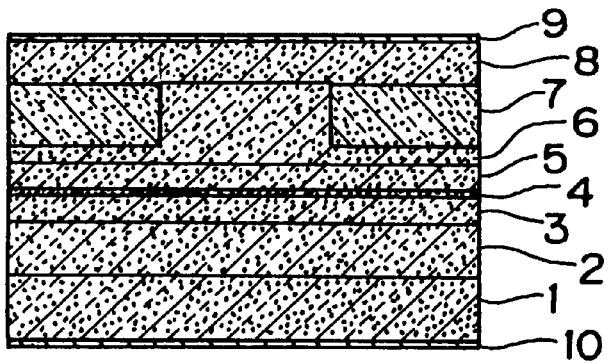

After the step of crystal growth described above, the front side ohmic electrode 9 of Au or the like is formed on top of the p-type GaAs contact layer 8 and the back side ohmic electrode 10 of Au or the like is formed on the bottom surface of the n-type GaAs substrate 1, thereby completing the semiconductor laser device of the present invention as shown in FIG. 2D.

Thus, by using the BTlGaAs layer for the active layer, it is possible to produce the semiconductor laser device on the GaAs substrate while establishing lattice matching with the GaAs substrate and providing good crystal characteristics.

According to the method of producing the semiconductor laser device of this embodiment, as described above, it is possible to form the BTlGaAs active layer, which lattice matches with the GaAs substrate and has good crystal characteristics, on the GaAs substrate.

By using the BTlGaAs active layer described above, a semiconductor laser device having an oscillation wavelength of 1.3 $\mu$m or 1.55 $\mu$m can be made.

In this semiconductor laser device, it is also possible to use AlGaAs layer as the clad layer, and the discontinuity in the conduction band between the active layer and the clad layers can be as large as 300 meV or higher, thereby achieving a good temperature characteristic, Embodiment 2

Now the second embodiment of the present invention will be described below with reference to FIG. 4.

Figure 4:
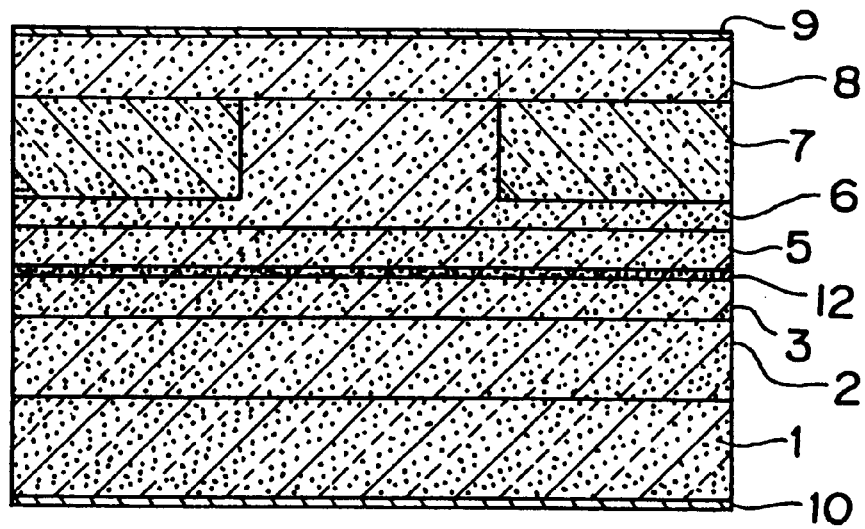
FIG. 4 is a cross sectional view of the stripe type strained quantum well laser according to the second embodiment of the present invention.

FIG. 4 is a cross sectional view of a stripe type strained quantum well semiconductor laser, where a $(B_{0.3}Tl_{0.7})_{0.36}Ga_{0.64}As$ strained quantum well layer is used as an active layer, showing a cross section perpendicular to the direction of a resonator. In the drawing, reference numerals identical with those used in FIG. 1 denote the identical or corresponding portions. Numeral 12 denotes a strained quantum well active layer of undoped $(B_{0.3}Tl_{0.7})_{0.36}Ga_{0.64}As$ having a thickness of 10 nm.

It is generally known that threshold current for laser oscillation can be reduced by employing a strained quantum well structure where an elastic strain is artificially generated in the well layer to such an extent that does not cause dislocations due to lattice mismatch. This means that, even when the lattice constant of the well layer is slightly different from that of the GaAs substrate, it is possible to prevent dislocations and lattice defects from being generated in the crystal and achieve quasi matching of the GaAs substrate and the active layer, by making the active layer sufficiently thin and keeping the active layer strained. By using the strained quantum well structure, it is possible to reduce the threshold current for laser oscillation with the active layer being strained.

According to the semiconductor laser device of this embodiment, as described above, proportions of B and Tl in the BTlGaAs, which lattice matches with the GaAs substrate, are changed so that the well layer is strained to such an extent that does not cause dislocations due to lattice mismatch in the quantum well structure, thereby achieving quasi lattices matching of the GaAs substrate and the BTlGaAs active layer.

According to this embodiment, as described above, it is possible to produce a semiconductor laser device having an oscillation wavelength of 1.3 $\mu$m or 1.55 $\mu$m on the GaAs substrate and, by using the strained quantum well structure, to produce the semiconductor laser device having a lower threshold current than that of a conventional device, without strain.

Embodiment 3

Now, the third embodiment of the present invention will be described below with reference to FIG. 5.

Figure 5:
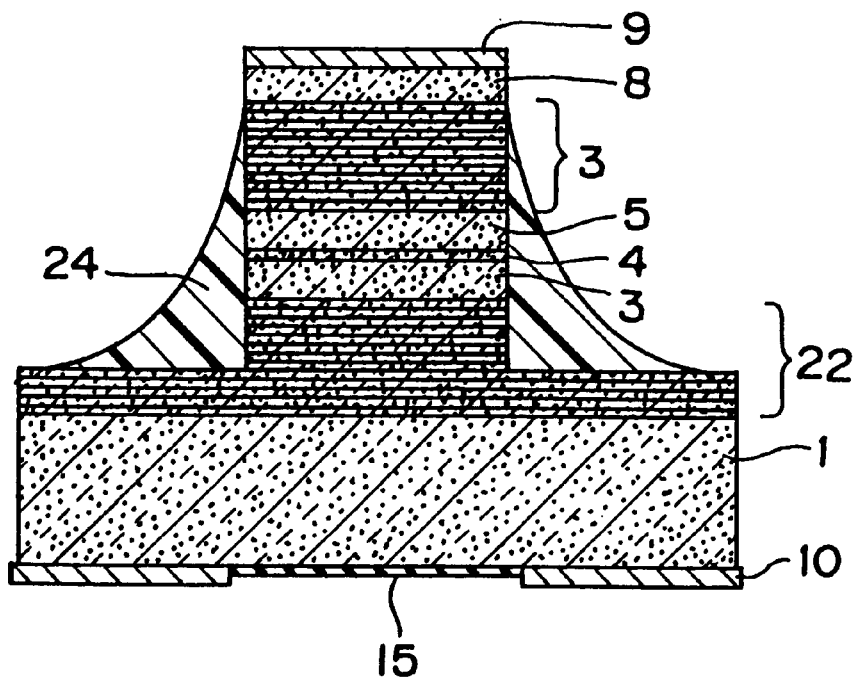
FIG. 5 is a cross sectional view of a surface-emitting laser with a perpendicular resonator type according to the third embodiment of the present invention.

FIG. 5 is a cross sectional view of a surface-emitting laser with a perpendicular resonator. In the drawing, reference numerals identical with those used in FIG. 1 denote identical or corresponding portions. Numeral 15 denotes a non-reflective coating, 22 denotes a lower multi-layer reflector film of n-type AlAs/GaAs, 23 denotes an upper multi-layer reflector film of p-type AlAs/GaAs and 24 denotes a polyimide layer.

In the surface-emitting laser with a perpendicular resonator, it is necessary to provide reflector layers sandwiching an active layer in order to cause resonance in the perpendicular direction. In a surface-emitting laser on an InP substrate according to the prior art, it has been inevitable to use a multi-layer dielectric film for the reflector film because it is impossible to form a multi-layer semiconductor film which lattice matches with the InP substrate and has a high level of reflectivity.

Since the multi-layer dielectric film is electrically insulating and does not allow current to flow, on the other hand, an electrode cannot be formed on the multi-layer dielectric film, thus making it necessary to change the structure of the semiconductor laser device.

According to this embodiment, however, since a GaAs substrate is used, the reflector film can be made by using a GaAs/AlAs multi-layer film which lattice matches with the GaAs substrate. In the GaAs/AlAs multi-layer film, there is a significant difference in the refractive index between GaAs and AlAs which allows a high reflectivity to be obtained with a small number of stacked layers, and the electrical conductivity thereof makes it possible to form the electrodes similar to the prior art.

Thus the configuration of this embodiment makes it possible to form the surface-emitting laser with a perpendicular resonator having an oscillation wavelength of 1.3 μm or 1.55 μm on a GaAs substrate.

According to the first to third embodiments, use of the GaAs substrate instead of the conventional InP substrate makes it possible to use a substrate with greater size than the InP substrate and that is hard to crack, improving the production yield and mass-producing semiconductor lasers.

What is claimed is:

1. A semiconductor laser comprising a first cladding layer of a first conductivity type, an active layer, a second cladding layer of a second conductivity type, and a contact layer of the second conductivity type arranged successively on a GaAs substrate of the first conductivity type, wherein the active layer is a GaAs based mixed crystal of Group III and Group V elements, having a zinc blende structure and comprises $(B_{1-y}Tl_y)_xGa_{1-x}As$, wherein $0.27 \leq x \leq 0.36$ and $0.62 \leq y \leq 0.70$.

2. The semiconductor laser device according to claim 1, wherein the active layer has a quantum well structure including layers of BTlGaAs and BTlAlGaAs.

3. The semiconductor laser device according to claim 2, wherein the BTlGaAs has a band gap energy corresponding to a wavelength of 1.3 μm.

4. The semiconductor laser device according to claim 2, wherein the BTlGaAs has a composition of $(B_{0.38}Tl_{0.62})_{0.27}Ga_{0.73}As$.

5. The semiconductor laser device according to claim 1, producing light having a peak wavelength of 1.3 μm.

6. The semiconductor laser device according to claim 1, wherein the active layer lattice matches or quasi matches with the GaAs substrate.

7. The semiconductor laser device according to claim 1, further comprising a reflecting layer in each of the first cladding layer and the second cladding layer, for supporting laser oscillation between the reflecting layers as a surface emitting laser with a perpendicular resonator.

8. The semiconductor laser device according to claim 7, wherein the reflecting layers are AlAs and GaAs.

9. The semiconductor laser device according to claim 1, wherein the first cladding layer and the second cladding layer are AlGaAs.

10. A method of producing a semiconductor laser device forming at least a first cladding layer, an active layer comprising $(B_{1-y}Tl_y)_xGa_{1-x}As$, wherein $0.27 \leq x \leq 0.36$ and $0.62 \leq y \leq 0.70$, a second cladding layer, and a contact layer, successively, on a GaAs substrate by organometallic vapor phase deposition.

11. The method according to claim 10, including using cyclopentadienyl thallium as a source of Tl in forming the active layer.

12. The method according to claim 10, including using triethylboron as a source of B in forming the active layer.

13. The method according to claim 12, including using cyclopentadienyl thallium as a source of Tl for the active layer.

14. The semiconductor laser device according to claim 2, wherein the BTlGaAs has a band gap energy corresponding to a wavelength of 1.55 μm.

15. The semiconductor laser device according to claim 2, wherein the BTlGaAs has a composition of $(B_{0.3}Tl_{0.7})_{0.36}Ga_{0.64}As$.

16. The semiconductor laser device according to claim 1, producing light having a peak wavelength of 1.55 μm.

* * * * *